United States Patent
Sawado et al.

(10) Patent No.: US 8,287,222 B2
(45) Date of Patent: Oct. 16, 2012

(54) TRANSFER SYSTEM

(75) Inventors: Kazutoshi Sawado, Tokyo (JP);
Yoshiaki Fujiwara, Ise (JP); Masanao Murata, Ise (JP); Takashi Yamaji, Ise (JP); Naofumi Kirihata, Ichinomiya (JP)

(73) Assignee: Muratec Automation Co., Ltd., Kyoto (JP)

( * ) Notice: Subject to any disclaimer, the term of this patent is extended or adjusted under 35 U.S.C. 154(b) by 272 days.

(21) Appl. No.: 12/703,739

(22) Filed: Feb. 10, 2010

(65) Prior Publication Data
US 2010/0202861 A1 Aug. 12, 2010

(30) Foreign Application Priority Data
Feb. 10, 2009 (JP) ................. 2009-028726

(51) Int. Cl.
*B65G 1/00* (2006.01)
(52) U.S. Cl. ....................... 414/279; 700/228
(58) Field of Classification Search .............. 700/228; 414/279, 222.07, 222.02, 222.01, 222.13, 414/266, 273, 749.1, 749.6
See application file for complete search history.

(56) References Cited

U.S. PATENT DOCUMENTS

| | | | | |
|---|---|---|---|---|
| 5,373,451 A | * | 12/1994 | Furukawa | 700/228 |
| 5,443,346 A | * | 8/1995 | Murata et al. | 414/222.13 |
| 5,746,008 A | * | 5/1998 | Yamashita et al. | 34/211 |
| 6,134,482 A | * | 10/2000 | Iwasaki | 700/121 |
| 6,622,057 B1 | * | 9/2003 | Ko et al. | 700/113 |
| 6,663,340 B1 | * | 12/2003 | Zeakes et al. | 414/788 |
| 6,715,978 B2 | * | 4/2004 | Lin et al. | 414/416.05 |
| 6,845,294 B2 | * | 1/2005 | Jevtic et al. | 700/228 |
| 7,441,999 B2 | * | 10/2008 | Nakao et al. | 414/217.1 |
| 2006/0222479 A1 | * | 10/2006 | Shiwaku et al. | 414/267 |
| 2008/0014061 A1 | * | 1/2008 | Izumi | 414/281 |
| 2008/0217278 A1 | * | 9/2008 | Murata | 212/224 |
| 2010/0204826 A1 | * | 8/2010 | Sawado et al. | 700/228 |

FOREIGN PATENT DOCUMENTS
JP 2001-509465 7/2001
JP 4182521 9/2008
* cited by examiner

*Primary Examiner* — Saul Rodriguez
*Assistant Examiner* — Glenn Myers
(74) *Attorney, Agent, or Firm* — Young & Thompson

(57) ABSTRACT

A transfer system includes: a first shelf disposed to block an original transfer path from a transfer position at which the transporting vehicle transfers the transported object to the port and can transfer the transported object with the transporting vehicle; a second shelf which puts the transported object; a displacing device can reciprocate the transported object with respect to the first shelf and the port in a first direction, toward and away from the processing apparatus, and which can reciprocate the transported object at first direction position, which is away in the first direction by the transported object from the first shelf and the port, in a second direction crossing the first direction; and a communicating device which receives a transfer request from the transporting vehicle, which can transmit a transfer permission to the transporting vehicle.

5 Claims, 6 Drawing Sheets

TRANSFER SYSTEM

BACKGROUND OF THE INVENTION

1. Field of the Invention

The present invention relates to a transfer system for transferring a transported object, such as a container which accommodates or houses various substrates for manufacturing semiconductor devices, between a processing apparatus, such as a semiconductor manufacturing apparatus, and a transporting vehicle, such as a vehicle, which travels along a track. Here, the "transported object" in the present invention means a product, an intermediate product, a part, an article, a work, a partly-finished good, a good or the like (e.g. a semiconductor or LCD device), or means a box or container for containing such a product or the like (e.g., a container containing the semiconductor or LCD device), which has been transported or is to be transported by a transporting carriage. The load may be a carrier for containing an object to be carried such as a FOUP.

2. Description of the Related Art

As this kind of transfer system, for example, such a system is commercialized that is fixed to the outer frame of a processing apparatus or the exterior of an outer casing and that transfers a transported object, such as a container which is referred to as a FOUP (Front Opening Unified Pod), between the system and the processing apparatus or between the system and the transporting vehicle. Specifically, the transfer system is equipped with two shelves, such as a port, for transferring the FOUP with the transporting vehicle on the top, and is equipped with six shelves, such as a buffer storage, for temporarily putting the FOUP below the port (e.g. refer to Japanese Patent No. 4182521).

Moreover, such a system has been suggested that is provided with a plurality of shelves, each of which can support the transported object, such as a wafer support pod; and a gripper, which can be displaced to any position in an X-Z plane including the plurality of shelves. Specifically, this system supplies the wafer support pod to the processing apparatus, such as a semiconductor process tool and a measurement tool (e.g. refer to Japanese Patent Kohyo (Japanese translation of PCT international application) No. 2001-509465).

However, the transfer system described in Japanese Patent No. 4182521 and Japanese Patent Kohyo No. 2001-509465 is firmly fixed to the outer frame of the processing apparatus or the exterior of the outer casing. In other words, once the main body of the transfer system is fixed to the processing process, it takes a long time for an operation of canceling the fixation. Moreover, when the transfer system main body is fixed to the processing apparatus, the front of the processing apparatus (in particular, a wall portion in which the port for taking the transported object in and out exists) is blocked. Thus, it is hard or impossible to perform operations associated with the repair, failure, and maintenance of the processing apparatus while the transfer system main body remains fixed. In other words, in order to perform the operation associated with the repair or the like, there arises a time-consuming operation of detaching the transfer system main body from the processing apparatus. Moreover, after that, when the transfer system main body is fixed again to the processing apparatus, there also arises a new fixation operation between the two, which requires a certain degree of positioning accuracy. Moreover, with regard to the transfer system main body, it is bulky in appearance to a non-negligible extent and its fixation position is limited, so that it will be a major hurdle when it is tried to save a space around the processing apparatus in a factory, which is technically problematic.

SUMMARY OF THE INVENTION

It is therefore an object of the present invention to provide a transfer system which can be easily fixed to a processing apparatus, with its system main body miniaturized.

The above object of the present invention can be achieved by a transfer system for transferring a transported object with a transporting vehicle, which travels along a track and which transports the transported object, and with a port which can take in and out the transported object or a processed object in a processing apparatus which performs a process on the processed object accommodated in the transported object, the transfer system provided with: a first shelf which is disposed to block an original transfer path in the middle which is from a transfer position at which the transporting vehicle transfers the transported object to the port and which can transfer the transported object with the transporting vehicle; a second shelf which can at least temporarily put the transported object; a displacing device which can reciprocate the transported object with respect to the first shelf and the port in a first direction, which is a direction coming close to and going away from the processing apparatus, and which can reciprocate the transported object at a first direction position, which is away in the first direction at least by the transported object from the first shelf and the port, in a second direction crossing the first direction; a communicating device which receives a first system signal indicating a transfer request associated with the transporting vehicle from the transporting vehicle or which transmits the first system signal to the transporting vehicle, which can transmit a second system signal indicating a transfer permission associated with the first shelf to the transporting vehicle or which can receive the second system signal from the transporting vehicle, which transmits the first system signal to the processing apparatus or which receives the first system signal from the processing apparatus, and which can receive the second system signal associated with the port from the processing apparatus or which can transmit the second system signal associated with the port to the processing apparatus; and a controlling device for controlling the communicating device to transmit and receive the first system signal and the second system signal associated with the port with the processing apparatus and for controlling the displacing device to transfer the transported object to the port in accordance with the second system signal associated with the port received from the processing apparatus or transmitted to the processing apparatus if the transported object transferred from the transporting vehicle to the first shelf or transferred from the first shelf to the second shelf is displaced to the port.

The processing apparatus of the present invention is a semiconductor manufacturing apparatus, such as a process apparatus and an inspection apparatus, and it performs a predetermined process (e.g. an exposure process, film formation, heat treatment, or the like) on the transported object, such as a FOUP, and actually on the processed object, such as wafers accommodated in the transported object. When the process is performed, typically, the transported object to be processed is transported to the processing apparatus by the transporting vehicle, such as an OHT (Overhead Hoist Transport), which travels along the track laid on a ceiling in a factory, such as a semiconductor manufacturing factory, and it is transferred from the transporting vehicle or to the port which can transfer it to the transporting vehicle. After that, for example, the processed object accommodated in the transported object on the port is taken out of the transported object by the displacing device of the processing apparatus, and it is taken into and out of the processing apparatus. Incidentally, if the processing apparatus is provided with a buffer in a form of the processed object which is taken into or out of the processing apparatus as a processing target, it is not necessarily the processed object itself as described above, but it may be the transported object itself (i.e. the transported object which accommodates the processed object). Incidentally, the control and the operation associated with the transfer between the transporting vehicle and the processing apparatus are typically performed, but are not limited to, on the basis of a sequence defined by E84 EPI/O (Enhanced Carrier Handoff Parallel I/O Interface) (Semi standard, hereinafter simply referred to "E84").

Here, for example, in semiconductor manufacturing, it is a challenge to improve the operating rate of the processing apparatus in order to ensure more production without expanding manufacturing facilities. For example, it is assumed that a waiting time for the transported object (i.e. the down time of the processing apparatus) between when the transported object on which the process has been completed is taken away from the port by a first transporting vehicle and when the transported object to be processed from now is brought to the port by a second transporting vehicle is several minutes. In contrast, the operating rate of the processing apparatus is 50% if it takes several minutes for the process in a first transported object. As described above, in order to improve the operating rate which reduces in accordance with the waiting time, it is requested to reduce the down time of the processing apparatus by quickly removing the transported object on which the process has been completed in the processing apparatus from the port and by quickly putting the transported object to be processed next onto the port (i.e. by quickly replacing the transported object on the port).

According to the transfer system of the present invention, the transfer system is a temporally-holding system or apparatus, such as a buffering system or apparatus for temporarily putting or holding the transported object on which the process is to be performed or has been performed by the processing apparatus. The displacing device and the communicating device described later are controlled by the controlling device, such as a controller, provided with a CPU, ROM, and RAM, which is connected to each device. According to the transfer system, for example, in the operation, firstly, the transportation and the process with respect to the first transported object are requested of the three elements on the basis of a semiconductor manufacturing schedule by the controlling device in the manufacturing system for integrally controlling the transfer system, the transporting vehicle, and the processing apparatus (hereinafter referred to as "three elements" as occasion demands). Then, the transporting vehicle which transports the first transported object is stopped at a position corresponding to the first shelf, and the first transported object is transferred from the transporting vehicle to the first shelf. Here, the "first shelf" means a shelf which is referred to as an "OHT port" and which has a put surface on which the transported object transferred from or to the transporting vehicle can be put. In the case where the first transported object is transferred to the first shelf, the first system signal indicating the transfer request and the second system signal indicating the transfer permission are transmitted or received with the transporting vehicle by the communicating device (i.e. for example, the transmitter if the communication destination is the transporting vehicle), such as a transmitter which can make optical communication like infrared rays and a communication cable mutually connected to a communication destination. Here, the "first system signal associated with the transporting vehicle" is a signal for transmitting an indication of the transfer to the first shelf is performed, to the transfer system, or a signal for transmitting an indication of the transfer to the port is performed, to the processing apparatus. Here, in contrast, the "second system signal associated with the first shelf" is, for example, a signal for transmitting an indication of the permission of the transfer to the first shelf. Thus, if the first transported object is transferred to the first shelf, the second system signal indicating the transfer permission is received by the transporting vehicle. The first transported object transferred to the first shelf is transferred from the first shelf to the port by the displacing device, such as a robot arm which can hold the flange of a FOUP and a transfer mechanism which can support the transported object from below. If the first transported object is transferred to the port, the first system signal and the second system signal are transmitted or received by the communicating device (i.e. for example, the communication cable if the communication destination is the processing apparatus). Here, the "first system signal" associated with the processing apparatus is a signal for transmitting an indication of the transfer to the port, to the processing apparatus. In contrast, the "second system signal associated with the port" is a signal for transmitting an indication of the permission of the transfer to the port, to the transfer system, or a signal for transmitting the same indication to the transporting vehicle. Thus, if the first transported object is transferred to the port, the second system signal indicating the transfer permission is received by the transfer system.

After the first transported object is transferred to the port, the processed object accommodated in the first transported object is displaced from the inside of the transported object on the port to the inside of the processing apparatus, for example, by an inner and outer displacing device in the processing apparatus. Then, the process is performed on the processed object within the processing apparatus. Then, the transportation and the process with respect to a second transported object to be processed next are requested of the three elements. Then, the transporting vehicle which transports the second transported object is stopped at the position corresponding to the first shelf, and the second transported object is transferred (i.e. brought) from the transporting vehicle to the first shelf. Then, the second transported object on the first shelf is transferred from the first shelf to the second shelf by the displacing device. Here, the "second shelf" means a shelf which is referred to as a "buffer" or a "buffer shelf" and which has a put surface on which either the first or second transported object can be temporarily put in order to replace the transported object on the port from the first transported object on which the process has been completed to the second transported object on the first shelf to be processed next. Then, if the process has been completed on the first processed object (actually, the processed object in the first transported object), the processed object is displaced by the inner and outer displacing device from the inside of the processing apparatus to the inside of the first transported object on the port. Then, the transportation (i.e. taking away) of the first transported object on which the process has been completed is requested of the transporting vehicle which is closest to the transfer apparatus or the processing apparatus, out of unloaded transporting vehicles which do not transport the transported object. After that, in parallel with that the first transported object on the port is transferred by the displacing device from the port to the first shelf (i.e. that the first transported object on which the process has been completed is taken away from the port), the transportation and the process (i.e. bringing in) with respect to a third transported object to be processed next to the second transported object are requested of the three elements. Then, the second transported object on the second shelf is transferred from the second shelf to the port, and the replacement of the transported object on the port is quickly performed. After that, by the transporting vehicle which is requested to transport the first transported object on which the process has been completed, the first transported object on the first shelf is transferred from the first shelf to the transporting vehicle (i.e. taken away). On the other hand, if the process has been completed on the second transported object on the port (actually, the processed object in the second transported object), the transportation (i.e. taking away) of the second transported object on which the process has been completed is requested of the transporting vehicle which is unloaded and which is closest to the transfer apparatus or the processing apparatus. As described above, by transferring the transported object to be processed from now to the first shelf in order and by using the second shelf to efficiently replace the transported object on the port on which the process has been completed by the transported object on the first shelf, it is possible to improve the operating rate of the processing apparatus. Incidentally, in the aforementioned example, the first system signal indicating the transfer request is transmitted from the transporting vehicle to the transfer system and from the transfer system to the processing apparatus, and the second system signal indicating the transfer permission is transmitted from the transfer system to the transporting vehicle and from the processing apparatus to the transfer system; however, the first and second system signals may be transmitted or received in the opposite direction to the above. In this case, the first system signal is transmitted from the transfer system to the transporting vehicle and from the processing apparatus to the transfer system, and the second system signal is transmitted from the transporting vehicle to the transfer system and from the transfer system to the processing apparatus. In other words, the targets of the transfer request and permission are opposite to those in the aforementioned example.

As described above, the transfer system of the present invention is provided only with: the one second shelf for replacing the transported object in the one port; and the first shelf for transferring the transported object with the transporting vehicle, as the shelf which can put or transfer the transported object. Thus, it is possible to make the transfer system main body small and light. Moreover, in the situation that the transfer system main body is miniaturized, the transfer system main body can be easily fixed to the one port (or processing apparatus), and there is provided the displacing apparatus which can be displaced among the one port, the first shelf, and the second shelf. Thus, the connection may be unnecessary.

Moreover, in particular, a signal received from the transporting vehicle and a signal transmitted to the processing apparatus by the communicating device which can communicate a parallel signal by optical communication, such as infrared rays, in the transfer system of the present invention are the first system signals indicating the transfer (e.g. "TR_REQ" in E84). On the other hand, a signal transmitted to the transporting vehicle and a signal received from the processing apparatus are the second system signals indicating the transfer permission (e.g. "READY" in E84). This means that even if the transfer is performed between the transporting vehicle and the processing apparatus without through the transfer system, the communication by the first system signal and the second system signal can be made, as in the present invention. In other words, in carrying out the present invention, there is no need to make a change on the system in the transporting vehicle and the processing apparatus. Therefore, simply, even if the transfer system is removed, there is little or no need to make a change in the exchange of the first and second system signals between the transporting vehicle and the processing apparatus. In contrast, even if the transfer system is installed in the processing apparatus, there is little or no need to make a change in the exchange of the first and second system signals between the transporting vehicle and the processing apparatus. In other words, from the standpoint of the transporting vehicle, there is little or no need to be aware of whether the signal is transmitted or received with respect to the transfer system, or whether the signal is transmitted or received with respect to the processing apparatus (i.e. whether or not there is the transfer system in front of the processing apparatus). In contrast, from the standpoint of the processing apparatus, there is little or no need to be aware of whether the signal is transmitted or received with respect to the transfer system, or whether the signal is transmitted or received with respect to the transporting vehicle (i.e. whether or not there is the transfer system in front of the transporting vehicle). Incidentally, the first or second system signal indicating the transfer request (e.g. "L_REQ" in E84) may be transmitted before the second system signal indicating the transfer permission described above, to the transporting vehicle by the communicating device.

Therefore, even on the system, the transfer system main body can be easily fixed to the one port.

Moreover, according to the transfer system of the present invention, with regard to the inner arrangement and the outer arrangement, firstly, the first shelf is disposed to block the original transfer path in the middle which is from the transfer position at which the transporting vehicle transfers the transported object, typically, the transfer position at which the transporting vehicle performs longitudinal transfer in the vertical direction, to the port. Thus, as viewed from the transporting vehicle side, it is possible to perform the transfer operation on the port if there is no transfer system and to perform the transfer operation on the first shelf if there is the transfer system, in almost the same manner.

In other words, with regard to the physical arrangement, the first shelf and the port provided in the transfer system are disposed in the same original transfer path although the heights are different as viewed from the transporting vehicle. Thus, there is little or no need to distinguish between the first shelf and the port in performing the transfer, such as longitudinal transfer. In contrast, the transporting vehicle and the displacing device owned by the transfer system transfer the transported object onto the same port in the same original transfer path or transfer the transported object from the same port although the heights are different as viewed from the processing apparatus. Thus, there is little or no need to distinguish with which the transfer is performed.

Therefore, not only on the system but also on the physical arrangement, the transfer system main body can be easily fixed to the one port.

Moreover, the displacing device can reciprocate the transported object with respect to the first shelf and the port in the first direction (e.g. horizontal one direction), which is a direction coming close to and going away from the processing apparatus, and more specifically, an outer frame, outer casing surface, side surface, or side wall on which the port is provided in the processing apparatus. Moreover, the displacing device can reciprocate the transported object at the first direction position (e.g. horizontal direction position), which is away in the first direction at least by the transported object from the first shelf and the port, in the second direction (e.g. vertical direction). Thus, it is possible to include a path or space for displacing the transported object in the transfer system main body, in an extremely small space. In particular, if such a condition is added that the second shelf which functions as the buffer does not block the path or space in the direction reciprocation of the transported object between the first shelf and the port, it is possible to approximately minimize the path or space for displacing the transported object in the transfer system main body as described above. In other words, it is possible to reduce the width of the path or space for displacing the transported object in the transfer system main body, within the width of the port. Thus, with respect to one processing apparatus provided with a plurality of ports, it is also possible to dispose the same number of transfer system main bodies as the number of ports in line along the track. In other words, it is also possible to make the outer width of the outer frame or outer casing or the like of the transfer system main body, equal to, or less than or equal to the pitch of the ports. By this, it is also possible to select whether or not to use the transfer system for each port, as occasion demands.

In one aspect of the transfer system of the present invention, the second shelf is disposed at a position of the first direction position, which is not obstructive when the displacing device displaces the transported object in the first direction and the second direction between the first shelf and the port.

According to this aspect, the second shelf is disposed at the position of the first direction position (e.g. a position at which a distance in the horizontal direction from the outer wall on which the port is provided in the processing apparatus is fixed), which is not obstructive when the transported object is displaced in the first direction (e.g. horizontal direction) and the second direction (e.g. vertical direction) between the first shelf and the second shelf. Specifically, for example, the second shelf is disposed near the lower limit in the movable range in the vertical direction of the displacing device, at the horizontal direction position located slightly below the port, which is close to the port disposed below the first shelf. Alternatively, the second shelf is disposed near the upper limit in the movable range in the vertical direction of the displacing device, at the horizontal direction position located slightly above the first shelf. Thus, it is possible to approximately minimize the path or space for displacing the transported object in the transfer system main body while the second shelf which particularly functions as the buffer does not block the path or space in the direct displacement of the transported object between the first shelf and the port. Thus, it is possible to approximately minimize the outer shape of the outer frame or outer casing or the like of the transfer system main body.

Alternatively, in another aspect of the transfer system of the present invention, the second shelf is disposed between the first shelf and the port in the original transfer path.

According to this aspect, the second shelf is disposed between the first shelf and the port in the original transfer path, and the three parts of the first shelf, the second shelf, and the port are disposed in such a form that they are distant from each other. Therefore, it is possible to approximately minimize the path or space for displacing the transported object in the transfer system main body while not blocking the path or space in the displacement of the transported object among the three parts at a second direction position.

In another aspect of the transfer system of the present invention, the processing apparatus has a plurality of ports, and a main body of the transfer system has a width which is less than or equal to an arrangement pitch of the ports in its outside dimension and is disposed such that the first direction matches a direction which is at right angles to a direction of arranging the ports.

According to this aspect, the transfer system main body has the width which is less than or equal to the arrangement pitch of the ports in its outside dimension, and typically, the first direction matches the direction which is at right angles to the direction of arranging the ports, wherein the direction of arranging the ports is along the track. Thus, it is possible to place a plurality of transfer system main bodies correspondingly to the ports, in a one-to-one manner. Since the width of the transfer system main body is small with respect to the width direction of the port, it is also possible to arrange the plurality of transfer system main bodies in accordance with the arrangement of the ports.

In another aspect of the transfer system of the present invention, the transporting vehicle longitudinally transfers the transported object in a vertical direction, the first direction is a horizontal one direction which is perpendicular to the vertical direction, and the second direction is the vertical direction.

According to this aspect, the transporting vehicle can perform the longitudinal transfer on the port along the original transfer path which extends in the vertical direction if the transfer system is not provided in the processing apparatus, and the transporting vehicle can also perform the longitudinal transfer on the first shelf along the original transfer path in the same manner even if the transfer system is provided in the processing apparatus. Moreover, by the displacing device displacing the transported object put on the first shelf in the horizontal one direction and the vertical direction, it is possible to displace it to the second shelf or the port. Alternatively, by the displacing device displacing the transported object put on the port in the horizontal one direction and the vertical direction, it is possible to displace it to the second shelf or the first shelf.

In this aspect, the transporting vehicle is provided with, for example, a hoist mechanism which can hoist the transported object, and the hoist mechanism holds the transported object within the transporting vehicle in the transportation (i.e. including the travel in the transportation) and brings down or pulls up the transported object in the vertical direction with a transfer shelf, such as a stocker or the port, of the processing apparatus or the like, in the transfer. Here, the "longitudinal transfer" in the transporting vehicle means that the transported object is transferred by the displacement in the vertical direction. Typically, the port of the processing apparatus is placed in the vertical direction of the track. In this case, according to this aspect, the first shelf is disposed between the port and the transporting vehicle which is stopped at the transfer position, and the second shelf is disposed below the first shelf, specifically, between the first shelf and the port, or below the port.

In another aspect of the transfer system of the present invention, the displacing device has: a holding device for holding the transported object; a first displacing part capable of reciprocating the holding device in the first direction; and a second displacing part capable of reciprocating the holding device in the second direction.

According to this aspect, the displacing device holds the transported object by using the holding device, such as a gripper which can hold the upper part of the transported object and a transfer mechanism which can support the transported object from below, in the operation. Then, the displacing device which holds the transported object is displaced in the first direction (e.g. horizontal one direction) and the second direction (e.g. vertical direction) among the port, the first shelf, and the second shelf (i.e. the three element) by the first displacing device, which is, for example, a horizontal displacing device, driven by the power of an actuator, a motor, or the like, and the second displacing device, which is, for example, a vertical displacing device. As described above, it is possible to quickly displace the transported object onto an arbitrary put surface of the three elements, by simple biaxial operation performed by the two-direction displacing devices.

The nature, utility, and further features of this invention will be more clearly apparent from the following detailed description with reference to preferred embodiments of the invention when read in conjunction with the accompanying drawings briefly described below.

DETAILED DESCRIPTION OF THE PREFERRED EMBODIMENT

Hereinafter, an embodiment of the present invention will be explained with reference to the drawings.

Embodiment

Structure of Manufacturing System

Figure 1:
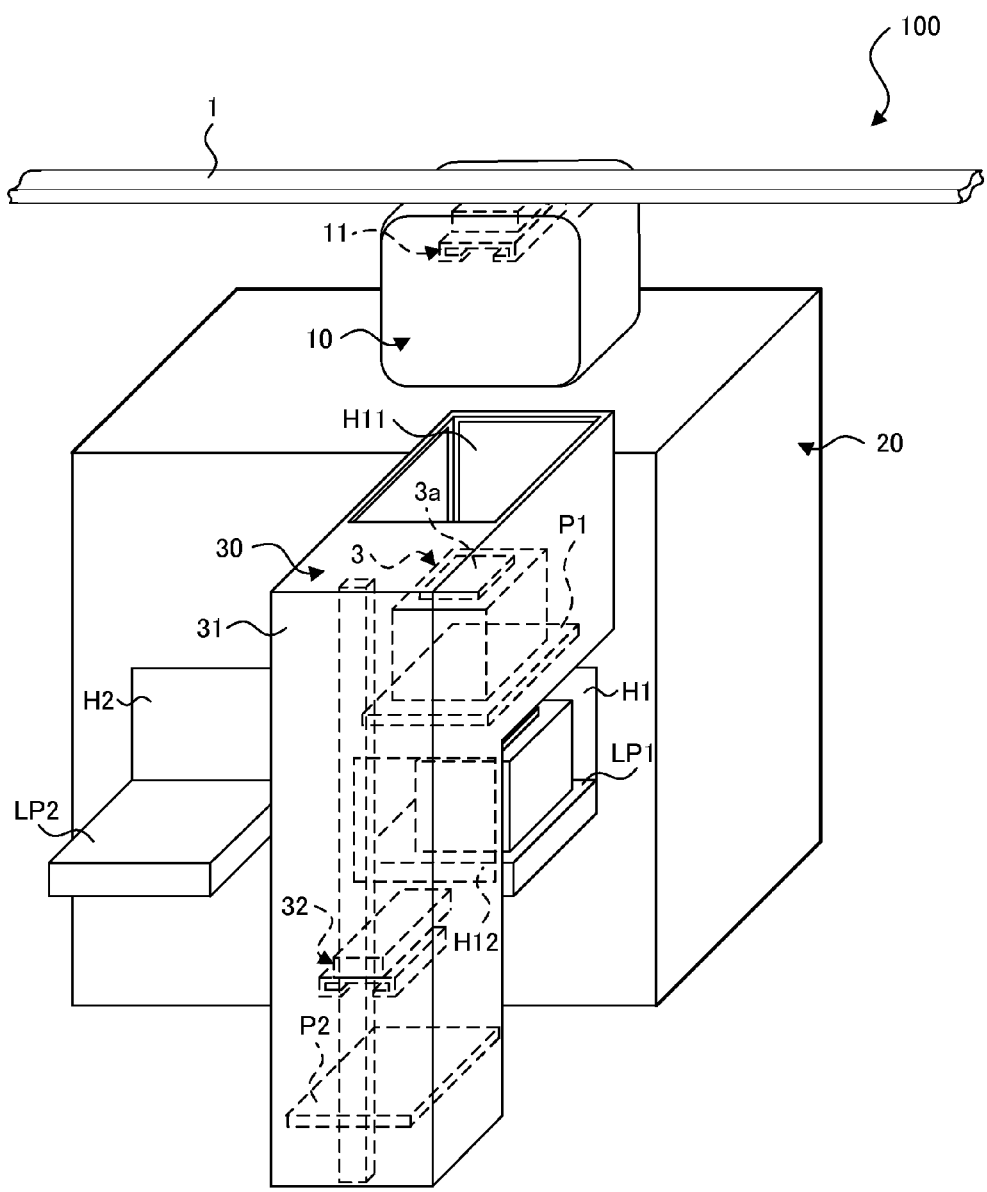
FIG. 1 is a perspective view showing the overall structure of a manufacturing system provided with a transfer system in an embodiment.
Figure 2:
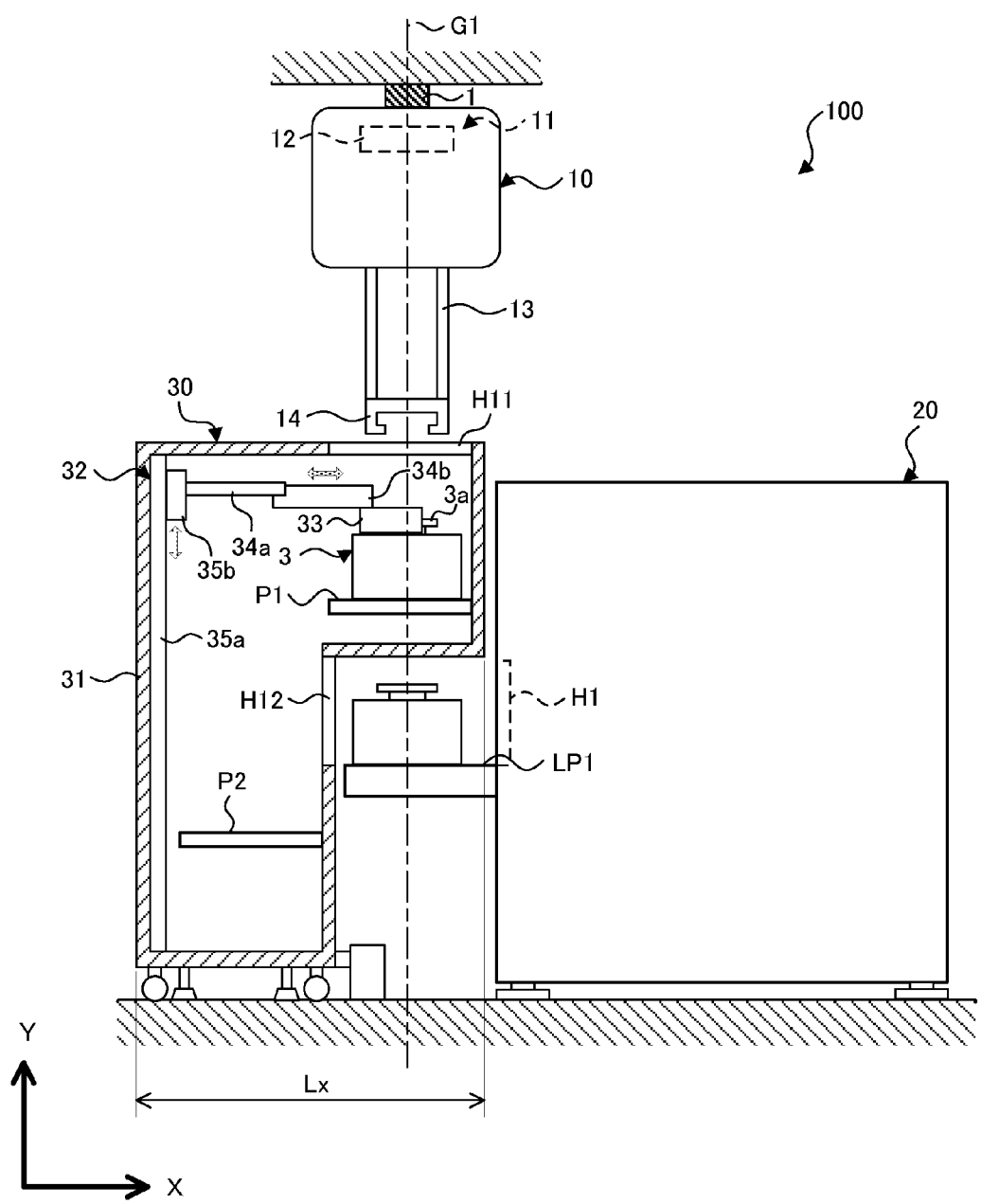
FIG. 2 is a cross sectional view in one direction showing a transporting apparatus in FIG. 1.
Figure 3:
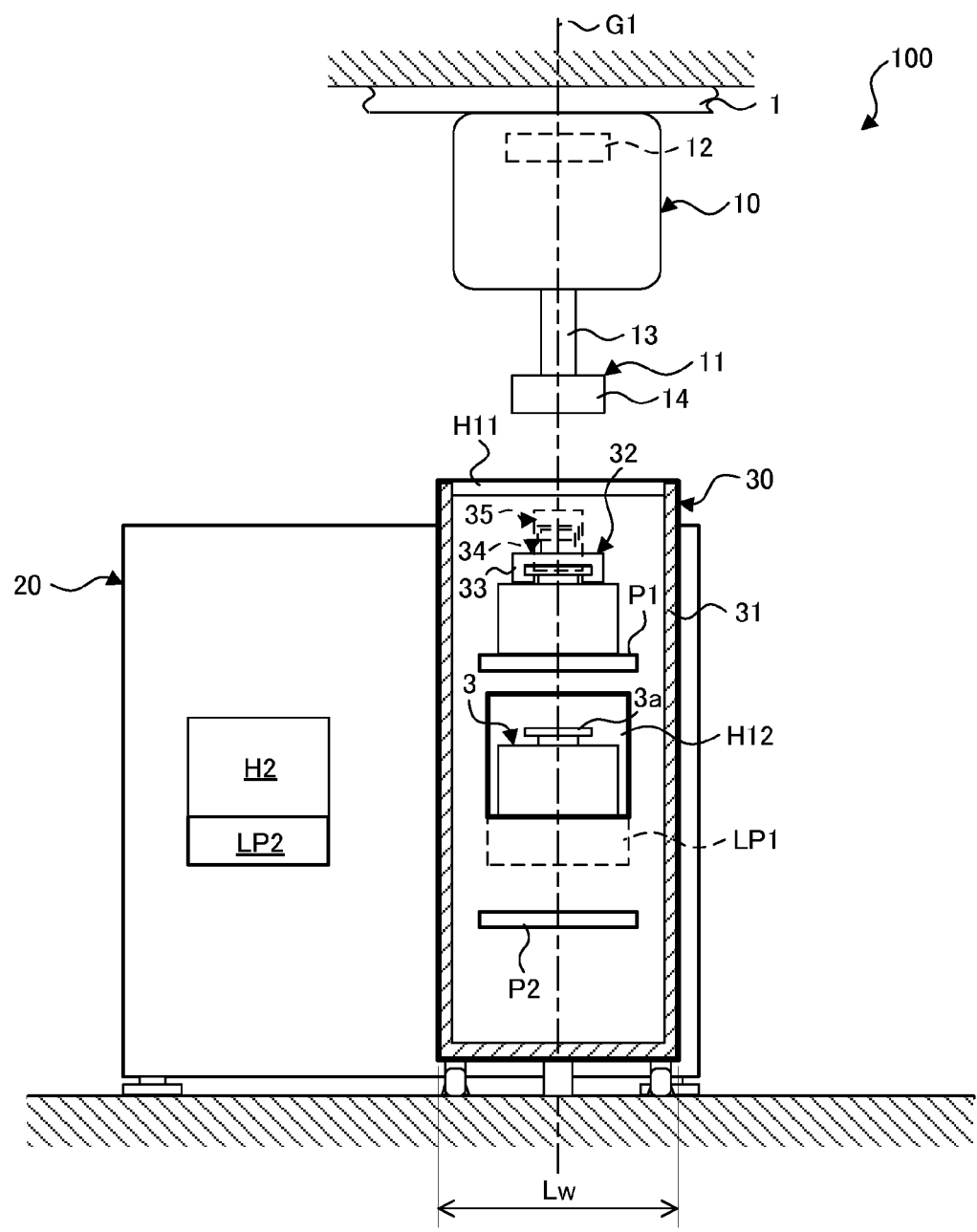
FIG. 3 is a cross sectional view in another direction showing the transporting apparatus in FIG. 1.

Firstly, the structure of a manufacturing system provided with a transfer system in an embodiment will be explained with reference to FIG. 1 to FIG. 3. FIG. 1 is a perspective view showing the overall structure of the manufacturing system provided with the transfer system in the embodiment. FIG. 2 is a one-direction cross sectional view conceptually showing a cross section if the transporting apparatus in FIG. 1 is cut in one direction (i.e. an anteroposterior or front-back direction in FIG. 1). FIG. 3 is an another-direction cross sectional view conceptually showing a cross section if the transporting apparatus in FIG. 1 is cut in another direction (i.e. in a horizontal direction in FIG. 1).

In FIG. 1, a manufacturing system 100 is provided with a rail 1, a vehicle 10, a manufacturing apparatus 20, and a buffer apparatus 30. The manufacturing system 100 has a transportation function, which allows the vehicle 10 to travel along the rail 1 and which transports a FOUP3 (i.e. one example of the "transported object" of the present invention) which can accommodate or house a plurality of wafers to the manufacturing apparatus 20; and a manufacturing function, which performs various processes on the wafers in the FOUP3 by using the manufacturing apparatus 20, thereby manufacturing a semiconductor element.

The rail 1 serves as a track for the vehicle 10 traveling, as one example of the "track" of the present invention. The rail 1 is laid on a ceiling in a factory in which the manufacturing system 100 is placed.

The vehicle 10 is an OHT (Overhead Hoist Transport) driven by using a linear motor as power, as one example of the "transporting vehicle" of the present invention, and it is attached to the rail 1 in a suspended form. The vehicle 10 travels along the rail 1 and transports the FOUP3 not only to the manufacturing apparatus 20 but also to a stocker, OHT buffer, large-scaled stocker, or the like not illustrated. The operations, such as transportation and travel, of the vehicle 10 are controlled by a vehicle controller described later. Incidentally, for convenience of explanation, only one vehicle 10 is illustrated on the rail 1; however, typically, more vehicles 10 (e.g. several tens or several hundreds) are provided.

The vehicle 10 is provided therein with a hoist mechanism 11, which has a winding device 12 having a not-illustrated winding shaft, a winding belt 13, and a gripper 14. One end of the winding belt 13 is fixed to the winding shaft, and the other end is fixed to the gripper 14. The winding device 12 rotates the winding shaft by using a not-illustrated motor as power, and it can wind up or wind off the winding belt 13 from the one end. The gripper 14 can be displaced into a holding state in which an upper part (i.e. flange) 3a of the FOUP3 is held on the both ends of the gripper 14 which are bent inward, or into a release state in which the flange 3a of the FOUP3 is released. By the winding belt 13 being wound up or wound off, the hoist mechanism 11 having such a structure hoists the gripper 14 in a vertical direction below the rail 1 and displaces the gripper 14 at a vertical position, thereby transferring the FOUP3 from the vehicle 10 side to the buffer apparatus 30 side described later, or from the buffer apparatus 30 side to the vehicle 10 side. As described above, in the embodiment, a transfer path by the vehicle 10 extends downward in the vertical direction from the transfer position of the vehicle 10 (i.e. a stop position shown in FIG. 1) to longitudinally transfer the FOUP3.

The manufacturing apparatus 20 performs a predetermined process on the FOUP3, and actually on the wafers accommodated in the FOUP3, as one example of the "processing apparatus" of the present invention. The manufacturing apparatus 20 is provided therein with a not-illustrated processing device for performing the predetermined process on the wafers, and two openings H1 and H2 which can bring in and out the wafer to be processed, in the processing device. The manufacturing apparatus 20 is provided with two load ports LP1 and LP2 which function as ports for transferring the FOUP3 with the buffer apparatus 30, in the exterior adjacent to each of the two openings H1 and H2 and below the rail 1. The manufacturing apparatus 20 is provided with a not-illustrated inner and outer transfer mechanism which brings in and out the wafers, which are in the FOUP3 transferred to each of the two load ports LP and LP2, in the processing device through the opening H1 or H2. The operations, such as bringing in and out the wafers, and the predetermined process, of the manufacturing apparatus 20 are controlled by a manufacturing controller described later. Incidentally, for convenience of explanation, only one manufacturing apparatus 20 is illustrated below the rail 1; however, typically, more manufacturing apparatuses 20 (e.g. several or several hundreds) are provided which perform different processes on the FOUP3. Moreover, the number of the openings and the load ports are not limited to two but may be three or more, and the arrangement thereof can be also in various aspects.

The buffer apparatus 30 transfers the FOUP3 with the vehicle 10 and with the manufacturing apparatus 20 such that the FOUP3 is efficiently transferred between the vehicle 10 and the manufacturing apparatus 20, as one example of the "transfer system" of the present invention. Incidentally, for convenience of explanation, only one buffer apparatus 30 corresponding to the one load port LP1 is illustrated on the manufacturing apparatus 20 provided with the two load ports LP1 and LP2; however, two buffer apparatuses 30 each corresponding to respective one of the load ports LP1 and LP2 may be provided as another embodiment.

The buffer apparatus 30 is provided with a main body part 31, an OHT port P1, a buffer P2, and a transfer mechanism 32. In FIG. 2, the main body part 31 is an inverted L-shaped case which can be installed from the front side (i.e. the left side in FIG. 2) to the load port LP1. The main body part 31 is disposed such that a longitudinal direction is a direction perpendicular to the orientation of the rail 1 (i.e. one example of the "horizontal one direction" of the present invention and an X direction in FIG. 2) in the installation. The main body part 31 has a length (i.e. a length Lx in FIG. 2) which allows at least two FOUPs 3 to be disposed in the X direction and has a length (i.e. a length Lw in FIG. 3) which allows at least one FOUP3 to be disposed in the orientation of the rail 1. Incidentally, for convenience of explanation, the structure of the buffer apparatus 30 in which the main body part 31 is installed to the load port LP1 will be explained.

Within the main body part 31, there are placed the OHT port P1, the buffer P2, and the transfer mechanism 32. The main body part 31 is provided with an opening H11 which can transfer the FOUP3 between the OHT port P1 and the vehicle 10, on an upper surface corresponding to the vertical direction of the rail 1 (i.e. shown by an alternate long and short dash line in FIG. 2 and FIG. 3). Moreover, the main body part 31 is provided with an opening H12 which can transfer the FOUP3 with the load port LP1 (i.e. the manufacturing apparatus 20), on the side surface adjacent to the FOUP3 put on the load port LP1.

The OHT port P1 functions as a port of the buffer apparatus 30 for transferring the FOUP3 on which the predetermined process is to be performed or has been performed in the manufacturing apparatus 20, through the opening H11 with the vehicle 10, as one example of the "first shelf" of the present invention. The OHT port P1 is placed above the load port LP1 in the vertical direction of the rail 1 such that the vehicle 10 can transfer the FOUP3 in a short time by longitudinal transfer (i.e. transfer which allows the FOUP3 to be displaced only in the vertical direction in the transfer). As is clear from FIG. 1 to FIG. 3, the OHT port P1 exists at a position to block the transfer path (i.e. the "original transfer path" of the present invention) when the vehicle 10 longitudinally transfers the FOUP3 with respect to the load port LP1 of the manufacturing apparatus 20 if the buffer apparatus 30 is removed. Thus, as viewed from the vehicle 10, it is only necessary to perform the transfer operation on the port which is at the same position in planar view, i.e. which is below the transfer position in the vertical direction, regardless of the presence of the buffer apparatus 30. In other words, if there is only a difference in the height of the port as viewed from the vehicle 10, the control with respect to the transfer operation by the vehicle 10 is almost the same, regardless of the presence of the buffer apparatus 30, so that it is extremely useful in practice.

The buffer P2 functions as a temporary put shelf for at least temporarily putting the FOUP3 on which the predetermined process is to be performed or has been performed in the manufacturing apparatus 20, as one example of the "second shelf" of the present invention. The buffer P2 is placed below the load port LP1 in the vertical direction of the rail 1 and in the X direction so that it does not block the transfer of the FOUP3 by the transfer mechanism 32 described later.

The transfer mechanism 32 is displaced among the load port LP1, the OHT port P1, and the buffer P2 and transfers the FOUP3 among them, as one example of the "displacing device" of the present invention. The transfer mechanism 32 is provided with a holding device 33, a horizontal displacement mechanism 34, and a hoist mechanism 35, and it is placed on the front side of the main body part 31 (i.e. the left side in FIG. 2). The holding device 33 is one example of the "holding device" of the present invention and has a pair of planar portions. The planar portions enter below the flange 3a in the X direction and support the both ends of the flange 3a from the below, thereby holding the FOUP3. As shown in FIG. 2, the horizontal displacement mechanism 34 is one example of the "horizontal displacing device" of the present invention, and it is provided with a rail part 34a placed such that the longitudinal direction is parallel to the X direction; and a slide part 34b which can be slid in the X direction along the rail part. To the tip of the horizontal displacement mechanism 34 (i.e. the end on the manufacturing apparatus 20 side of the slide part 34b), the holding device 33 is fixed. The hoist mechanism 35 is one example of the "vertical displacing device" of the present invention, and it is provided with a turn belt 35a which can turn in the vertical direction by using a not-illustrated motor as a power source; and a hoist device 35b which is displaced in the vertical direction with the turn of the turn belt. To the hoist device 35b, one end of the rail part 34a is fixed.

The transfer mechanism 32 displaces the holding device 33 in the X direction (i.e. one example of the "first direction" of the present invention) and in the vertical direction (e.g. one example of the "second direction" of the present invention) among the load port LP1, the OHT port P1, and the buffer P2 by the mutual operation performed by the horizontal displacement mechanism 34 and the hoist mechanism 35 described above, and the transfer mechanism 32 holds or releases the FOUP3 on the holding device 33, thereby transferring the FOUP3 among them. The operations, such as the displacement of the transfer mechanism 32 and the transfer of the FOUP3, are controller by a buffer controller described later.

<System Structure of Manufacturing System>

Figure 5:
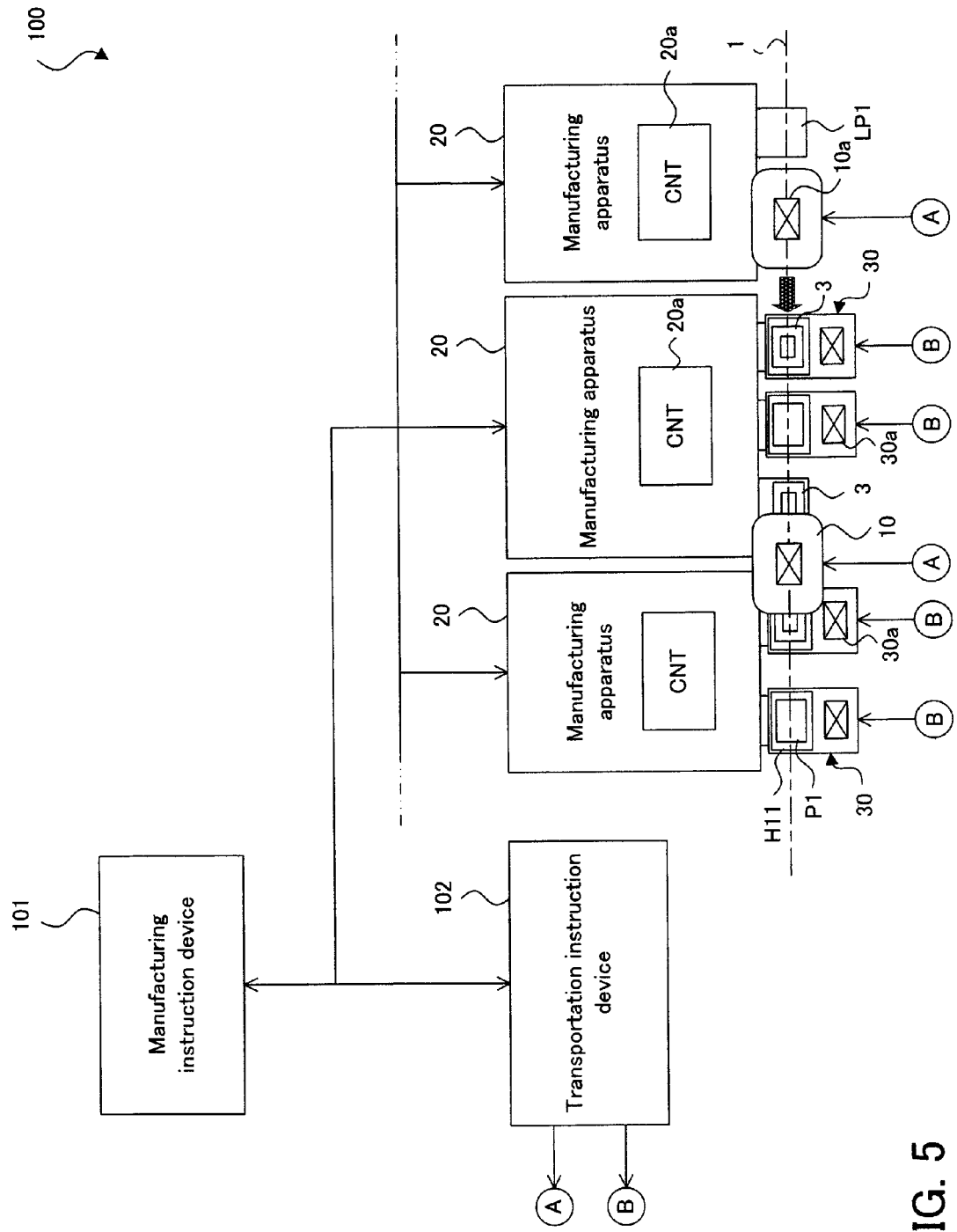
FIG. 5 is a block diagram showing the system structure of the manufacturing system in FIG. 1.
Figure 6:
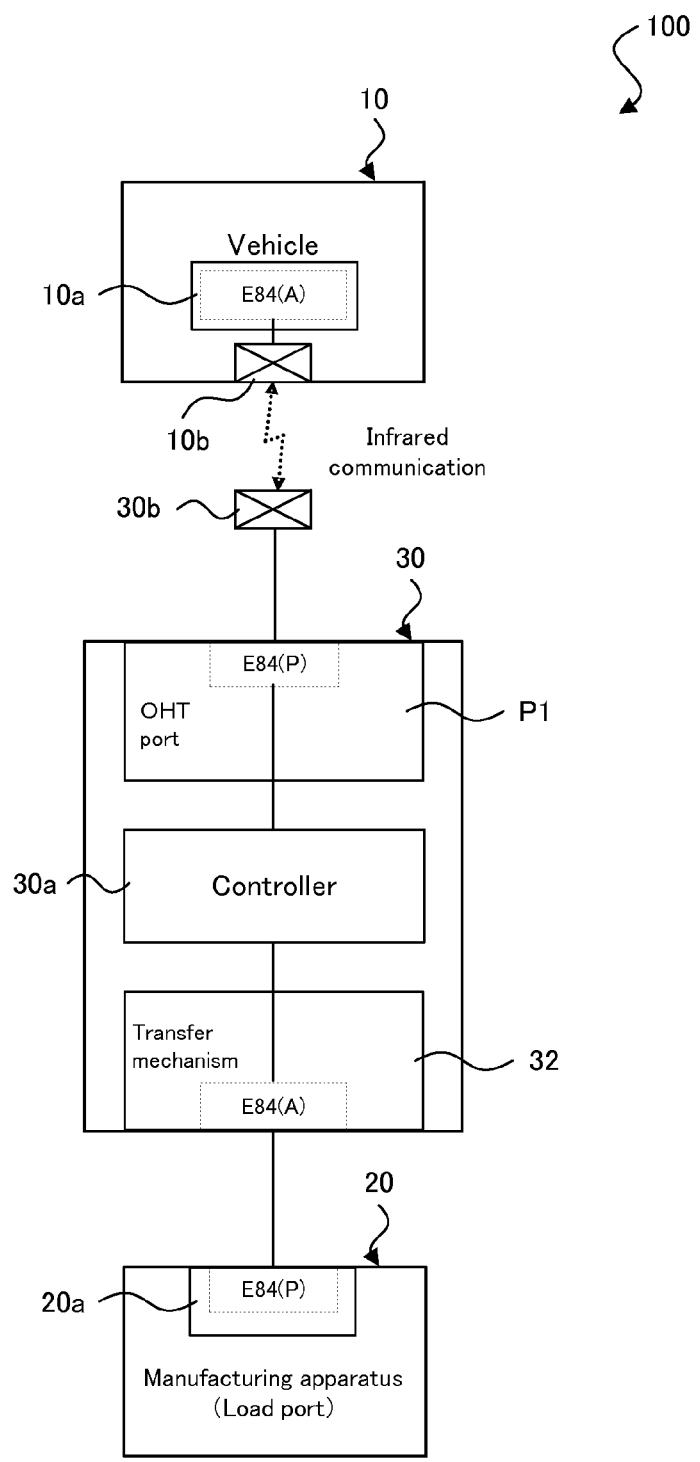
FIG. 6 is an explanatory diagram explaining a communication method in the manufacturing system in FIG. 1.

Next, the system structure of the manufacturing system 100 will be explained with reference to FIG. 5 and FIG. 6. FIG. 5 is a block diagram showing the system structure of the manufacturing system 100 in FIG. 1. FIG. 6 is an explanatory diagram explaining a communication method among the buffer 30, the vehicle 10, and the manufacturing apparatus 20 in FIG. 5 (the transfer system, the transporting vehicle, and the processing apparatus in the embodiment).

In FIG. 5, the manufacturing system 100 is provided with a manufacturing instruction device 101, a transportation instruction device 102, a vehicle controller 10a for controlling each device of the vehicle 10, a manufacturing controller 20a for controlling each device of the manufacturing apparatus 20, and a buffer controller 30a for controlling each device of the buffer apparatus 30, as a control system.

The manufacturing instruction device 101 generates a semiconductor manufacturing schedule from information inputted by a manufacturing system administrator, instructs each wiredly-connected manufacturing controller 20a to perform a process on a predetermined FOUP3 (actually, wafers accommodated in the FOUP3) on the basis of the generated semiconductor manufacturing schedule, and instructs the wiredly-connected transportation instruction device 102 to transport the predetermined FOUP3 to be processed. The manufacturing instruction device 101 functions as a host computer in the manufacturing system 100.

The transportation instruction device 102 includes an OHVC (Overhead Hoist Vehicle Controller). The transportation instruction device 102 generates a transportation schedule on the basis of a request from the manufacturing instruction device 101, instructs each wirelessly-connected vehicle controller 10a to transport the predetermined FOUP3 on the rail 1 on the basis of the generated transportation schedule, and instructs each wiredly-connected buffer controller 30a to transfer the predetermined FOUP3 to be processed in the manufacturing apparatus installed.

In FIG. 6, the vehicle controller 10a is provided with a transceiver 10b for E84 communication, and it is connected to the buffer controller 30a by infrared rays through the transceiver 10b. The vehicle controller 10a transmits an "E84(A)" signal (i.e. one example of the "first system signal" of the present invention) to the buffer controller 30a, in the transfer from the vehicle 10 to the OHT port P1. Here, "E84(A)" in the vehicle controller 10a is a signal indicating that the FOUP3 is to be transferred onto the OHT port P1 (in other words, a transfer request). The vehicle controller 10a controls the hoist mechanism 11 to transfer the FOUP3 onto the OHT port P1 in accordance with a reply from the buffer controller 30a.

The buffer controller 30a is one example of the "controlling device" of the present invention and one portion of the "communicating device". The buffer controller 30a is provided with a transceiver 30b (one portion of the "communicating device" of the present invention) which is the same as in the vehicle controller 10a, and it is connected to the vehicle controller 10a through the transceiver 30b. The buffer controller 30a responds to the "E84(A)" signal from the vehicle controller 10a and transmits an "E84(P)" signal (i.e. one example of the "second system signal" of the present invention) to the vehicle controller 10a. Here, "E84(P)" in the buffer controller 30a is a signal indicating whether or not the FOUP3 is put on the OHT port P1 and/or whether or not the FOUP3 can be transferred onto the OHT port P1 (in other words, a transfer permission).

On the other hand, the buffer controller 30a is wiredly connected to the manufacturing controller 20a and transmits an "E84(A)" signal in the same system as in the signal transmitted from the vehicle controller 10a to the buffer controller 30a, to the manufacturing controller 20a, in the transfer from the OHT port P1 or the buffer P2 to the load port LP1. Here, "E84(A)" in the buffer controller 30a is a signal indicating that the FOUP3 is to be transferred onto the load port LP1 (in other words, a transfer request). The buffer controller 30a controls the transfer mechanism 32 to transfer the FOUP3 onto the load port LP1, in response to a reply from the manufacturing controller 20a.

The manufacturing controller 20a responds to the "E84(A)" signal from the buffer controller 30a and transmits an "E84(P)" signal in the same system as in the signal transmitted from the buffer controller 30a to the vehicle controller 10a, to the buffer controller 30a. Here, "E84(P)" in the manufacturing controller 20a is a signal indicating whether or not the FOUP3 is put on the load port LP1, whether or not the FOUP3 can be transferred onto the load port LP1, and/or whether or not the process for the wafers in the FOUP3 on the load port LP1 is performed (in other words, a transfer permission).

As described above, the signal transmitted by the vehicle controller 10a and the signal transmitted by the buffer controller 30a to the manufacturing controller 20a are in the same system, and the signal transmitted by the manufacturing controller 20a and the signal transmitted by the buffer controller 30a to the vehicle controller 20a are in the same system. This eliminates a need to change the signal, control command, process, or program or the like, exchanged in each of the vehicle controller 10a and the manufacturing controller 20a, with or without the transfer via the buffer apparatus 30. Thus, it is possible to easily install the buffer apparatus 30 to the load port LP1, thereby increasing the degree of freedom of the installation of the buffer apparatus 30. Incidentally, the aforementioned exchange of the "E84(A)" or "E84(P)" signal is hereinafter referred to collectively as "E84 communication", as occasion demands.

<Transfer Operation Process in Manufacturing System>

Figure 4:
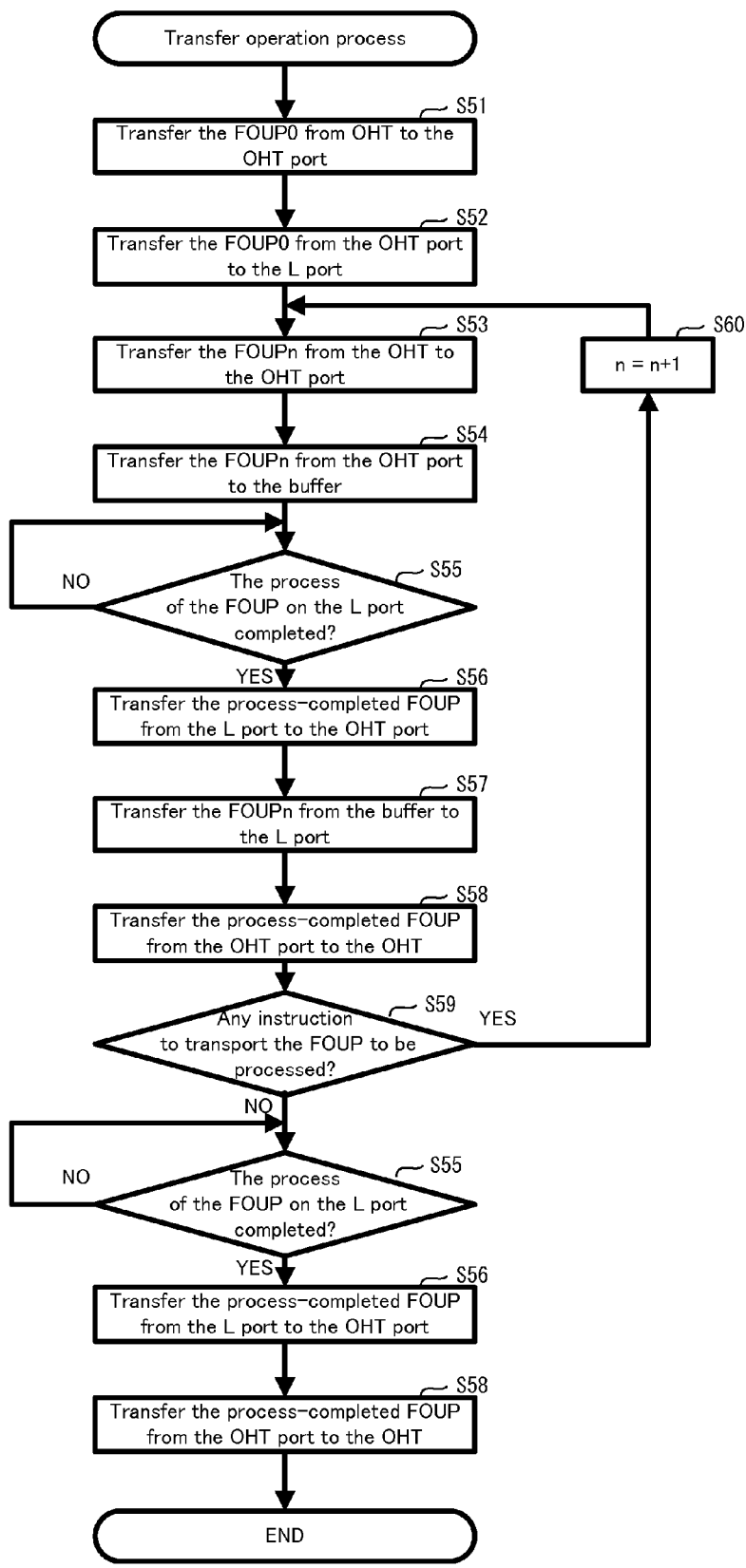
FIG. 4 is a flowchart showing a transfer operation process in the embodiment.

Next, the transfer operation between the transporting vehicle and the processing apparatus via the transferring apparatus in the manufacturing system 100 will be explained with reference to FIG. 4. FIG. 4 is a flowchart showing the transfer operation process in the embodiment.

In FIG. 4, firstly, the manufacturing apparatus 20 is instructed to perform the process for the predetermined FOUP3 on the basis of the semiconductor manufacturing schedule generated by the manufacturing instruction device 101. Moreover, the vehicle 10 is instructed to transport the FOUP3 on which the process in the manufacturing apparatus 20 is to be performed, and the buffer apparatus 30 is instructed to transfer the FOUP3 on which the process in the manufacturing apparatus 20 is performed, by the transportation instruction device 102 on the basis of the semiconductor manufacturing schedule. Here, it is assumed that the FOUP which is the first transportation target is "FOUP0". After that, under the control of the vehicle controller 10a, the vehicle 10 (i.e. written as "OHT" in FIG. 4) travels along the rail 1 and stops at a predetermined transfer position corresponding to the buffer apparatus 30 (i.e. stop position shown in FIG. 1 to FIG. 3). Then, it is confirmed that the FOUP0 transported by the vehicle 10 can be transferred from the vehicle 10 to the OHT port P1 by the E84 communication between the vehicle 10a and the buffer controller 30a. Then, by the hoist mechanism 11, the gripper 14 holding the FOUP0 is lowered in the vertical direction through the opening H11 in the buffer apparatus 30 from the inside of the vehicle 10, and the FOUP0 is released from the gripper 14 at the vertical position at which the FOUP0 is in contact with the upper surface of the OHT port P1. In other words, the FOUP0 is transferred from the vehicle 10 to the OHT port P1 (step S51).

Then, in the buffer apparatus 30, under the control of the buffer controller 30a, the holding device 33 is displaced to below the flange 3a of the FOUP0 on the OHT port P1 by the horizontal displacement mechanism 34, and the hoist mechanism 35 before the holding device 33 is raised until it comes into contact with the lower surface of the flange 3a. In this manner, the FOUP0 is held by the holding device 33. Then, it is confirmed that the FOUP0 can be transferred from the OHT port P1 to the load port LP1 by the E84 communication between the buffer controller 30 and the manufacturing controller 20a. Then, the holding device 33 which holds the FOUP0 is displaced to above the load port LP1 (i.e. written as "L port" in FIG. 6) through the opening H12 before the holding device 33 is lowered until the FOUP0 comes into contact with the load port LP1. In this manner, the FOUP0 is transferred from the OHT port P1 to the load port LP1 (step S52). After that, the holding device 33 is horizontally displaced to the side of the FOUP0 on the load port P1, and the FOUP0 is released from the holding device 33. The wafers in the FOUP0 transferred to the load port LP1 are temporarily accommodated in the manufacturing apparatus 20 under the control of the manufacturing controller 20a, and the predetermined process is performed inside before the wafers are put into the FOUP0 on the load port LP1 again.

Then, on the basis of a new instruction from the transportation instruction device 102, as in the operation in the step S51, it is confirmed that the FOUP3 can be transferred onto the OHT port P1 by the E84 communication with the buffer controller 30a, under the control of the vehicle controller 10a, and then, a FOUPn (i.e. "n" is a variable indicating the order that the FOUP3 is transported) which is a second transportation target is transferred onto the OHT port P1 from the vehicle 10 which has arrived at a new transfer position which is different from the previous one (step S53). Then, under the control of the buffer controller 30a, the holding device 33 which holds the FOUPn on the OHT port P1 is displaced to above the buffer P2 by the horizontal displacement mechanism 34 and the hoist mechanism 35 before the holding device 33 is lowered until the FOUPn comes into contact with the buffer P2. In this manner, the FOUPn is transferred from the OHT port P1 to the buffer P2 (step S54).

Then, it is judged whether or not the predetermined process in the manufacturing apparatus 20 has been completed on the FOUP (here, FOUP0) on the load port LP1, by the E84 communication between the buffer controller 30a and the manufacturing controller 20a (step S55). As a result of the judgment, if it is judged that the predetermined process has not been completed (the step S55: NO), it becomes in a standby state until the predetermined process has been completed.

On the other hand, as a result of the judgment in the step S55, if it is judged that the predetermined process has been completed on the FOUP (here, FOUP0) on the load port LP1 (the step S55: YES), the FOUP on which the process has been completed is transferred from the load port LP1 to the OHT port P1 by the transfer mechanism 32 (step S56). At this time, the FOUP on which the process has been completed is displaced to the OHT port P1 such that it slips through above the FOUPn put on the buffer P2. Then, it is confirmed that the FOUP3 can be transferred onto the load port LP1 by the E84 communication between the buffer controller 30a and the manufacturing controller 20a, and then, the FOUPn is transferred from the buffer P2 to the load port LP1 by the transfer mechanism 32 which is unloaded (i.e. which no longer holds the FOUP3) (step S57).

After that, on the basis of the instruction from the transportation instruction device 102, the vehicle 10 of the transfer mechanism 32 which is unloaded (i.e. which no longer holds the FOUP3) is stopped at a predetermined transfer position. Then, under the control of the vehicle controller 10a, it is confirmed that the FOUP3 to be transferred is put on the OHT port P1 by the E84 communication with the buffer controller 30a. Then, the unloaded gripper 14 is lowered in the vertical direction through the opening H11 by the hoist mechanism 11, and the FOUP on which the process has been completed is held by the gripper 14. In other words, the FOUP on which the process has been completed is transferred from the OHT port P1 to the vehicle 10 (step S58). After that, the gripper 14 which holds the FOUP on which the process has been completed is raised by the hoist mechanism 11 and is held within the vehicle 10. In this manner, the vehicle 10 becomes in the state that it can travel.

Then, by the E84 communication between the vehicle 10 and the buffer apparatus 30, it is judged whether or not there is an instruction to transport the FOUP3 to be processed, by the transportation instruction device 102 (step S59). As a result, if it is judged that there is the instruction (the step S59: YES), the FOUP which is a third transportation target is set to "FOUPn+1" (step S60). Then, as in the operation in the step S51, the FOUPn+1 which is the third transportation target is transferred to the OHT port P1 from the vehicle 10 which has arrived at a new transfer position which is different from the previous one, as the operation in the step S53 again. After that, the FOUPn+1 is transferred from the OHT port P1 to the buffer P2, as the operations in the step S54 to the step S59. Then, it is judged whether or not the predetermined process has been completed on the FOUP (here, FOUPn) on the load port LP1, and when it is judged that the predetermined process has been completed, the FOUP on which the process has been completed is transferred from the load port LP1 to the OHT port P1. Then, after the FOUPn+1 is transferred from the buffer P2 to the load port LP1, if the FOUP on which the process has been completed is transferred from the OHT port P1 to the vehicle 10, it is judged whether or not there is another instruction to transport the FOUP3 to be processed.

On the other hand, as a result of the judgment in the step S59, if it is judged that there is no further instruction (the step S59: NO), it is judged whether or not the predetermined process has been completed on the FOUP (here, FOUPn+x (i.e. "n+x" is shown on the FOUP3 which is the last transportation target)) on the load port LP1 as the operations in the steps S55, S56, and S58. If the predetermined process has been completed, when the last FOUP on which process has been completed is transferred from the load port LP1 to the OHT port P1, the last FOUP is transferred from the OHT port P1 to the vehicle 10. By this, all the FOUPs3 on which the predetermined process is performed in the manufacturing apparatus 20 are transferred to the vehicle 10 through the buffer apparatus 30, and the series of transfer operation process is ended.

As described above, according to the transfer operation process in the embodiment, it is possible to improve the operating rate of the manufacturing apparatus 20 by using the buffer P2 for replacing the FOUP3 on the load port LP1 to efficiently replace the FOUP3 on which the process has been completed by the FOUP3 to be processed from now.

Incidentally, the operation in the step S58 may be performed in tandem with the step S57 if it is after the FOUP3 on which the process has been completed is transferred to the OHT port P1 as the operation in the step S56.

The invention may be embodied in other specific forms without departing from the spirit or essential characteristics thereof. The present embodiments are therefore to be regarded in all respects as illustrative and not restrictive, the scope of the invention being indicated by the appended claims rather than by the foregoing description and all changes which come within the meaning and range of equivalency of the claims are therefore intended to be embraced therein. For example, a transfer system provided with two second shelves for two ports (i.e. in which two buffer apparatuses 30 in the embodiment are arranged side by side) is also included in the technical scope of the invention.

The entire disclosure of Japanese Patent Application No. 2009-028726 filed on Feb. 10, 2009 including the specification, claims, drawings and summary is incorporated herein by reference in its entirety.

What is claimed is:

1. A transfer system for transferring a transported object with a transporting vehicle, which travels along a track and which transports the transported object, and with a port which can put the transported object and which can take in and out the transported object or a processed object in a processing apparatus, which performs a process on the processed object accommodated in the transported object, the transfer system comprising:

a first shelf which is disposed to block an original transfer path in the middle which is from a transfer position at which the transporting vehicle transfers the transported object to the port and which can transfer the transported object with the transporting vehicle;

a second shelf which can at least temporarily put the transported object;

a displacing device which can reciprocate the transported object with respect to the first shelf and the port in a first direction, which is a direction coming close to and going away from the processing apparatus, and which can reciprocate the transported object at a first direction position, which is away in the first direction from the first shelf and the port, in a second direction crossing the first direction;

a communicating device which has a first communicating device and a second communicating device, the first communicating device which receives a first system signal indicating a transfer request associated with the transporting vehicle from the transporting vehicle or which transmits the first system signal to the transporting vehicle, the first communicating device which can transmit a second system signal indicating a transfer permission associated with the first shelf to the transporting vehicle or which can receive the second system signal from the transporting vehicle, and the second communicating device which transmits the first system signal to the processing apparatus or which receives the first system signal from the processing apparatus, and the second communicating device which can receive the second system signal associated with the port from the processing apparatus or which can transmit the second system signal associated with the port to the processing apparatus; and a controlling device for controlling the second communicating device to transmit and receive the first system signal and the second system signal associated with the port with the processing apparatus and for controlling the displacing device to transfer the transported object to the port in accordance with the second system signal associated with the port received from the processing apparatus or transmitted to the processing apparatus if the transported object transferred from the transporting vehicle to the first shelf or transferred from the first shelf to the second shelf is displaced to the port.

2. The transfer system according to claim 1, wherein the second shelf is disposed at a position of the first direction position, which is not obstructive when the displacing device displaces the transported object in the first direction and the second direction between the first shelf and the port.

3. The transfer system according to claim 1, wherein
the processing apparatus has a plurality of ports, and
a main body of the transfer system has a width which is less than or equal to an arrangement pitch of the ports in its outside dimension and is disposed such that the first direction matches a direction which is at right angles to a direction of arranging the ports.

4. The transfer system according to claim 1, wherein the transporting vehicle transfers the transported object in a vertical direction,
the first direction is a horizontal one direction which is perpendicular to the vertical direction, and
the second direction is the vertical direction.

5. The transfer system according to claim 1, wherein
the displacing device has:
a holding device for holding the transported object;
a first displacing part capable of reciprocating the holding device in the first direction; and
a second displacing part capable of reciprocating the holding device in the second direction.

* * * * *